United States Patent
Kamakura

(10) Patent No.: US 7,968,420 B2
(45) Date of Patent: Jun. 28, 2011

(54) MANUFACTURING SEMICONDUCTOR DEVICE AND METHOD OF MANUFACTURING ELECTRONIC APPARATUS

(75) Inventor: Tomoyuki Kamakura, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 545 days.

(21) Appl. No.: 11/742,731

(22) Filed: May 1, 2007

(65) Prior Publication Data

US 2007/0264759 A1  Nov. 15, 2007

(30) Foreign Application Priority Data

May 11, 2006  (JP) ................................. 2006-132953

(51) Int. Cl.
*H01L 21/20* (2006.01)
*H01L 21/44* (2006.01)

(52) U.S. Cl. . 438/396; 438/399; 438/597; 257/E21.008; 257/E21.011

(58) Field of Classification Search .................. 438/396, 438/399, 597; 257/E21.008, E21.011
See application file for complete search history.

(56) References Cited

U.S. PATENT DOCUMENTS

| 5,892,286 A | 4/1999 | Toyoda et al. |
| 7,199,033 B2 | 4/2007 | Hirai et al. |
| 7,365,008 B2 | 4/2008 | Hirai et al. |
| 2005/0022374 A1* | 2/2005 | Hirai et al. ..................... 29/825 |

FOREIGN PATENT DOCUMENTS

| JP | A-07-106324 | 4/1995 |
| JP | A-10-012617 | 1/1998 |
| JP | A 2005-12181 | 1/2005 |
| JP | A-2006-114930 | 4/2006 |

* cited by examiner

*Primary Examiner* — Alexander G Ghyka
*Assistant Examiner* — Seahvosh J Nikmanesh
(74) *Attorney, Agent, or Firm* — Oliff & Berridge, PLC

(57) ABSTRACT

A method for manufacturing a semiconductor device, includes: forming an insulating film on a substrate; selectively removing the insulating film, so as to form a groove including a first groove area having a first depth and a second groove area having a second depth, the second depth being smaller than the first depth; infusing a conductive liquid material into the first groove area and the second groove area; treating the conductive liquid material, so as to form a first conductive film in the first groove area and a second conductive film in the second groove area; and forming a second insulating film on the first and the second conductive films, followed by forming a third conductive film on the second insulating film.

16 Claims, 11 Drawing Sheets

MANUFACTURING SEMICONDUCTOR DEVICE AND METHOD OF MANUFACTURING ELECTRONIC APPARATUS

BACKGROUND

1. Technical Field

Several aspects of the present invention relate to a method for manufacturing a semiconductor device, particularly to a method for forming an interconnection (conductive film) of a semiconductor device.

2. Related Art

Semiconductor devices have a multilayer structure including semiconductor films, insulating films, and conductive films. As the element size of semiconductor devices decreases, forming those semiconductor devices finer (i.e. narrower and thinner) is increasingly required.

Techniques using liquid material for forming components such as thin film transistors (TFTs) and interconnections of semiconductor elements on a glass substrate have been developed, so as to constitute a display unit or a drive unit of a display such as a liquid crystal device or an organic electroluminescence device.

For instance, a patterning method is disclosed in JP-A-2005-121181 the method including forming a bank (B) on a substrate (P) and depositing a functional fluid (L) on a region (A) partitioned by the bank (B), in order to form a thin linear pattern in a high precision. The numerals in the parentheses are quoted from the JP-A-2005-12181.

The inventor is engaged in research and development of semiconductor devices, studying the optimal method for forming, interconnections in the formation of circuits and the like that have semiconductor elements such as TFT.

His study includes not only a designing of the finer interconnections, but also an optimal method for forming the interconnections in order to achieve very small sized elements and highly integrated interconnections, since forming of interconnections in a multilayer structure is critical for such purposes.

If interconnections are deposited as a multilayer, parasitic capacitance is generated between the interconnections arranged one on top of the other, with an interlayer insulating film therebetween. Due to the parasitic capacitance, the rapid operation of the interconnections is disturbed. In order to reduce this parasitic capacitance, the measures may be taken, for instance, increasing the thickness of the interlayer insulating film, or using low-conductivity (low-k) materials for interlayer insulating film.

These measures, however, increase the film stress and generate cracking of the films, possibly resulting in a degradation of element characteristics such as interconnection between the films and TFTs. Particularly, film deposition on a large-sized substrate or a flexible substrate requires film stress reduction. Thus, measures other than the above is important for reducing the parasitic capacitance.

Moreover, capacitors (capacitance) are often incorporated into a display unit or a drive unit of the display device. In order to ensure a large capacitance in the capacitors, it is necessary to make the top-to-bottom distance of the interconnection (i.e., thickness of the insulating film) small. In order to increase the capacitance, it has been necessary to design the capacitor insulating film to be manufactured in a different process from that of the interlayer insulating film. At the same time, it has been necessary to compose the capacitor insulating film with a high-conductivity (high-k) material.

SUMMARY

An advantage of the invention is to provide a method for forming interconnections that reduces parasitic capacitance in multilayer interconnections (interconnections arranged top-to-bottom), and to provide such interconnection structure. Another advantage of the invention is to provide a method for forming interconnections that reduces parasitic capacitance of the multilayer interconnections (interconnections arranged top-to-bottom), and to provide a method for forming interconnections and the structure thereof that increases the capacitance of capacitors at low cost.

According to a first aspect of the invention, a method for manufacturing a semiconductor device includes: forming an insulating film on a substrate; selectively removing the insulating film, so as to form a groove including a first groove area having a first depth and a second groove area having a second depth, the second depth being smaller than the first depth; infusing a conductive liquid material into the first groove area and the second groove area; treating the conductive liquid material, so as to form a first conductive film in the first groove area and a second conductive film in the second groove area; and forming a second insulating film on the first and the second conductive films, followed by forming a third conductive film on the second insulating film.

According to a second aspect of the invention, a method for manufacturing a semiconductor device includes: forming a first conductive film and a second conductive film on a substrate; forming an insulating film on the first and the second conductive films; selectively removing the insulating film, so as to form a groove including a first groove area above the first conductive film and a second groove area above the second conductive film, the groove being such that a distance from the first conductive film and the bottom of the first groove area is longer than the distance from the second conductive film to the bottom of the second grove area; infusing a conductive liquid material into the groove; and treating the conductive liquid material, so as to form a third conductive film in the groove.

Such method can increase the distance between the first conductive film and the third conductive film, reducing parasitic capacitance. Moreover, the distance between the second conductive film and the third conductive film can be decreased, increasing the capacitance therebetween.

It is preferable that the second conductive film serve as a first electrode constituting a capacitor, and an area located above the second conductive film in the third conductive film serves as a second electrode constituting the capacitor. Such method can increase the capacitance of the capacitor.

It is preferable that the first conductive film serve as a first interconnection; and the third conductive film except for the second electrode therein serves as a second interconnection. Such method can reduce the parasitic capacitance between the first interconnection and the second interconnection.

It is preferable that the groove include an incline between an area above the first conductive film and an area above the second conductive film. Such method allows forming the third conductive film as a continuous interconnection.

It is preferable that the groove include a first incline, a flat area, and a second incline, between an area above the first conductive film and an area above the second conductive film. With such method, the flat portion allows an efficient filling of the first incline with the conductive liquid material.

It is preferable that the groove include a first incline, a reverse incline, and a second incline, between an area above the first conductive film and an area above the second conductive film. With such method, the reverse incline allows an efficient filling of the first incline with the conductive liquid material.

It is preferable that the infusion of a conductive liquid material include the conductive liquid material being introduced after discharging the conductive liquid material to a fluid reservoir wider than the groove, the fluid reservoir being arranged at an edge of the groove. Such method allows an introduction of the conductive liquid material from the liquid reservoir to the second groove.

It is preferable that the groove include a wide groove having a first width and a narrow groove having a second width, the narrow groove located approximately in the center of the wide groove. With such method, the width and the thickness of the conductive film is defined by the width and the depth of the narrow groove. Therefore, the third conductive film with predefined width and thickness can be formed. Particularly, this method contributes in making the size of the interconnection (conductive film) smaller.

It is preferable that the groove include a wide groove having a first width and a narrow groove having a second width, the narrow groove located approximately in the center of the wide groove, where the depth of the narrow groove is approximately constant, and the depth of the wide groove is smaller at the area above the first conductive film than that of the area above the second conductive film. With such method, the width and the thickness of the conductive film is defined by the width and the depth of the narrow groove. Therefore, the third conductive film with predefined width and thickness can be formed. Moreover, by making the depth of the wide groove at the portion above the second conductive film different from the one at the portion above the first conductive film, the position of the groove's bottom (in other words, distance between the first or the second conductive film and the third conductive film) can be easily changed.

It is preferable that, in infusing the conductive liquid material, the conductive liquid material be introduced after discharging the conductive liquid material to a fluid reservoir wider than the narrow groove, the fluid reservoir being arranged at the edge of the groove. Such method allows an introduction of the conductive liquid material from the liquid reservoir to the narrow groove.

It is preferable that the infusion of the conductive liquid material be carried out by seeping the conductive liquid material with an inkjet method. Such method allows an infusion of the conductive liquid material to the groove.

It is preferable that the discharging of the conductive liquid material to the liquid reservoir be carried out by seeping a droplet of the conductive liquid material with an inkjet method, the second width being partially smaller than the size of the droplet; and the width of the liquid reservoir being larger than the size of the droplet. Such method allows forming the conductive film, the width thereof being smaller than the size of the droplet.

It is preferable that the insulating film be composed with photosensitive material. Such method allows an easy modification of the bottom position of the groove by adjusting the exposure dose. Moreover, adjusting the exposure dose allows the wide groove and the narrow groove to be formed easily with fewer processes.

It is preferable that the treatment be carried out by performing a heat treatment to the conductive liquid material that includes conductive fine particles and a dispersion medium. Such method allows a formation of the conductive film in which the conductive fine particles are sintered.

It is preferable that the treatment be carried out by growing the conductive film with plating, and the conductive liquid material include a catalyst. Such method allows a formation of the conductive film grown by plating (electroless plating).

According to a third aspect of the invention, a method for manufacturing an electronic apparatus having the semiconductor device includes the method for manufacturing a semiconductor device. Here, the "electronic apparatus" means apparatuses in general provided with a semiconductor device according to the embodiments of the invention. These apparatuses are provided with given functions, and are formed with electro-optical devices or memories. No particular limitation is imposed on the composition of those apparatuses. Examples of such apparatuses include: an integrated circuit (IC) card, a mobile phone, a video camera, a personal computer, a head-mounted display, a rear/front projector, fax machine with a display, a viewfinder of a digital camera, a mobile television, a PDA, an electronic notebook, a video billboard, and an display for commercial messages. Here, the "electro-optical devices" means devices in general provided with a semiconductor device according to the embodiments of the invention, as well as with an electro-optical element that changes the state of the externally supplied lights or lights emitted by an electric effect. Such electro-optical devices include the following two kinds of devices. One is the self light-emitting kind and the other is the external-light-suppressing kind. Examples of such electro-optical devices include a liquid crystal element, an electro phoretic element that has electrophoretic particle dispersion, an electroluminescence (EL) element, and an active-matrix display provided with an electron emitter that emits light by hitting a luminescent plate with electrons generated by an electric field.

According to a fourth aspect of the invention, a semiconductor device includes: an insulating film formed on a substrate: a groove formed in the insulating film, the groove including a first groove area having a first depth and a second groove area having a second depth; a first conductive film formed in the first groove area; a second conductive film formed in the second groove area; and a third conductive film formed on the first and the second conductive films, having a second insulating film therebetween.

According to a fifth aspect of the invention, a semiconductor device includes: a first conductive film and a second conductive film formed on a substrate; an insulating film formed on the first conductive film and the second conductive film; a groove, formed in the insulating film, and having a first groove area above the first conductive film and a second groove area above the second conductive film, the groove being such that a distance from the first conductive film to the bottom of the first groove area is longer than the distance from the second conductive film to the bottom of the second grove area; and a third conductive film formed in the groove.

Such structure can increase the distance between the first conductive film and the third conductive film, reducing parasitic capacitance. Moreover, the distance between the second conductive film and the third conductive film can be decreased, increasing the capacitance therebetween.

It is preferable that the groove include a wide groove having a first width and a narrow groove having a second width, the narrow groove located approximately in the center of the wide groove, the depth of the narrow groove being approximately constant; and the depth of the wide groove being smaller at the area above the first conductive film than that of the area above the second conductive film.

This allows making the width and the thickness of the third conductive film correspond with the second width and the second depth of the second groove. Moreover, by making the depth of the first groove at the portion above the second conductive film different from the one at the portion above the first conductive film, the distance between the first and the third conductive films can be increased. Thus, the parasitic capacitance between them can be reduced. Moreover, the distance between the second conductive film and the third conductive film can be decreased, increasing the capacitance therebetween.

According to a sixth aspect of the invention, an electronic apparatus having a semiconductor device includes the semiconductor device described above.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1A:
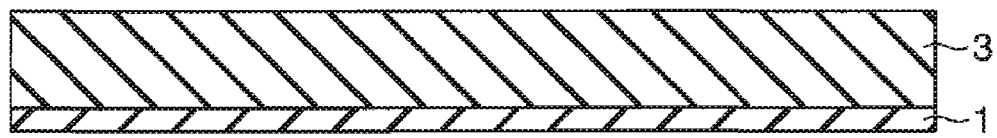
FIGS. 1A and 1B are sectional views of steps showing a method for manufacturing an interconnection according to one embodiment of the invention.

Embodiments of the invention will now be described in detail with references to the accompanying drawings. To omit the repetitive descriptions, like reference numerals designate like functional elements.

First Embodiment

FIGS. 1A to 5B are drawings of sectional views of processes and top views of main parts, showing a method for manufacturing an interconnection (a method for manufacturing a semiconductor device) according to the first embodiment of the invention.

As shown in FIG. 1A, a glass substrate 1, such as quartz, transparent, and insulating substrates, is prepared. An unillustrated underlying protection film is formed thereon. This underlying protection film is composed with, for instance, oxide silicon film, and is formed using gaseous sources such as tetraethoxysilane (TEOS or tetra ethyl ortho silicate) and oxygen, with a plasma chemical vapor deposition (CVD) method. This underlying protection film may also be formed by spin coating the spin on glass (SOG) material, and thereafter carrying out a heat treatment. Subsequently, a photoresist is spin coated as a photosensitive insulating films on the glass substrate 1, so as to form a photoresist film 3 on the underlying protection film.

Figure 1B:
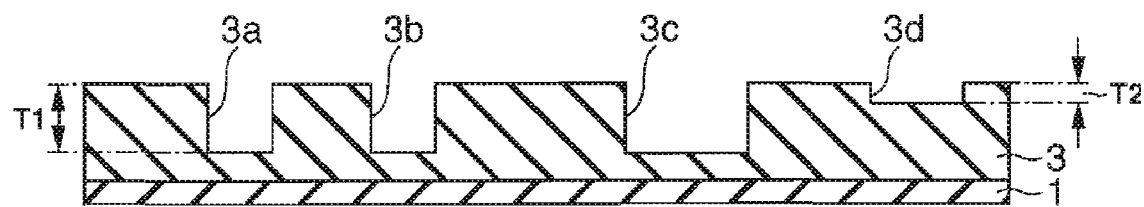
Figure 2:
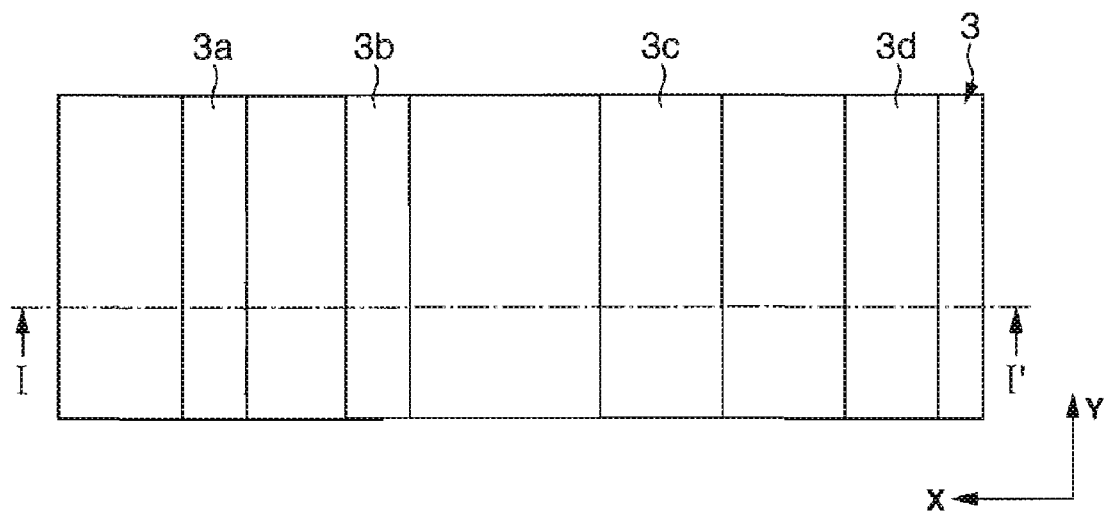
FIG. 2 is a top view of main parts showing the method for manufacturing an interconnection according to the above embodiment of the invention.

Grooves (interconnection grooves) 3a to 3d are then formed on the surface of the photoresist film 3, by carrying out exposure and lithography to this photoresist film 3 (photolithography). Referring now to FIG. 2, the shapes of these grooves 3a to 3d will be described. FIG. 1B corresponds to a section cut along the line I-I' in FIG. 2.

As shown in FIG. 2, the grooves 3a to 3d extend in the v-axis direction, each having a desired width. The grooves 3a to 3c have a depth T1, and the groove 3d has a depth T2 (T2<T1). In other words, the groove 3d is shallower than the grooves 3a to 3c. That is to say, the bottom surface of the groove 3d is at a higher position than the bottom surfaces of the grooves 3a to 3c. Here, a structure referred to as a "groove" (concave or recess) is shaped with projections at both sides. Such projection may also be referred to as a "bank".

The grooves 3a to 3d having such shapes are formed by exposure and development of the photoresist film 3. A standard mask aligner such as a stepper, a mirror projection mask aligner (MPA), or a PLA may be used. A maskless lithography system (digital micromirror device) described in a third embodiment may also be used. Moreover, by reducing the exposure dose in the groove 3d compared to that of the grooves 3a to 3c, the depth T2 of the groove 3d becomes shallow.

As described, an etching process can be omitted by using the photosensitive insulating film (the photoresist film 3), thereby allowing to form the grooves 3a to 3d in fewer processes. Moreover, by adjusting the exposure dose, the grooves with different depths are formed.

The photosensitive insulating film (the photoresist film 3) also serves as an interlayer insulating film. Polymeric material that has a siloxane skeleton, or other polymeric materials such as acryls, olefins, melanins, and polyimides are suitable.

The grooves 3a to 3d may be formed by patterning a non-photosensitive insulating film as well. For example, the grooves 3a to 3c that have the depth T1 is formed, and thereafter the groove 3d that has the depth T2 is formed. When forming the groove 3d, the grooves 3a to 3c need to be covered with a photoresist film.

In order to facilitate the flow of the conductive liquid material into the grooves 3a to 3c, it is desirable to provide liquid repellency to the surface of the photoresist film 3 by fluoride resin coating or plasma treatment, prior to forming the grooves 3a to 3c. The desired pattern (grooves) are then formed with the above-mentioned aligner.

Figure 3A:
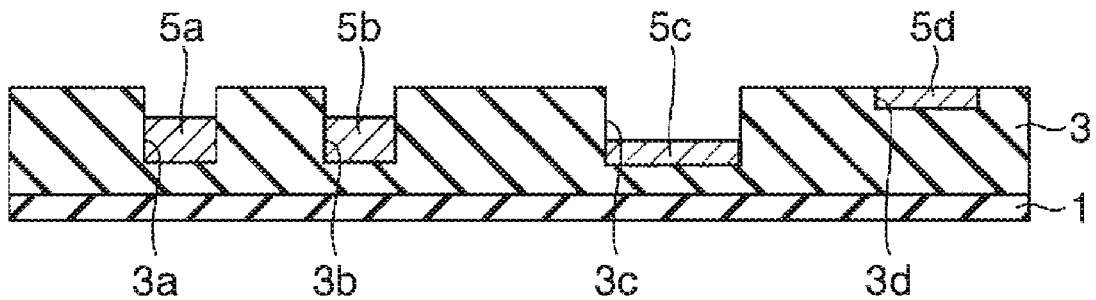
FIGS. 3A to 3C are sectional views of steps showing a method for manufacturing an interconnection according to the above embodiment of the invention.

Thereafter, as shown in FIG. 3A, the conductive liquid material, such as functional fluid or liquid material, is infused into the grooves 3a to 3d with a droplet discharge method such as droplet discharge, inkjet, or printing method. The droplets may be discharged on demand along the grooves 3a to 3d. The droplets may also be discharged collectively into a liquid reservoir (a pool) installed with a continuous connection to the grooves 3a to 3d, so as to introduce the droplets into the grooves 3a to 3d. Here, the width of the liquid reservoir is wider than each of the widths of the grooves. With this method, the liquid material can be filled into the grooves that are narrower than the droplet size (droplet diameter) of the conductive liquid material. Here, the width of the grooves, except for the part corresponding to the capacitor area, is smaller than the droplet size, and the width of the liquid reservoir is larger than the droplet size.

The volume of the conductive liquid material infused into the grooves 3a to 3d is optionally adjusted so that the conductive films with desired thicknesses are formed in the grooves 3a to 3d. Subsequently, a heat treatment (drying and firing) is performed on the conductive liquid material in the grooves 3a to 3d, so as to form the conductive films (interconnections) in the grooves 3a to 3d (refer to FIG. 3A). Here, conductive films 5a and 5b become the interconnections leading out from a source and a drain of TFT. A conductive film 5c becomes a lower layer interconnection, and a conductive film 5d becomes a lower electrode of a capacitor Ca.

Figure 3B:
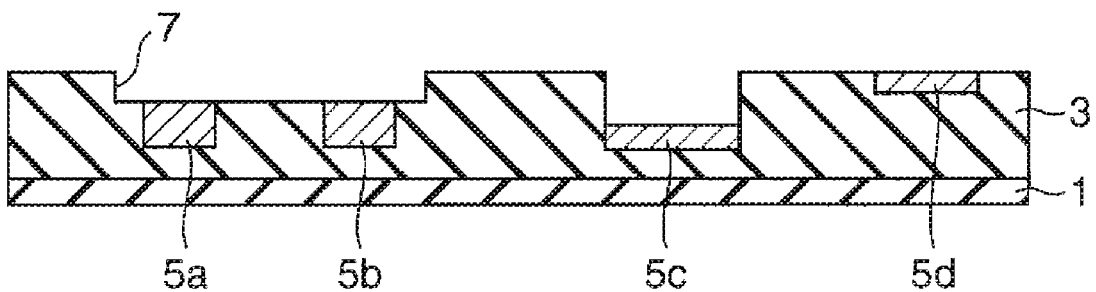
Figure 3C:
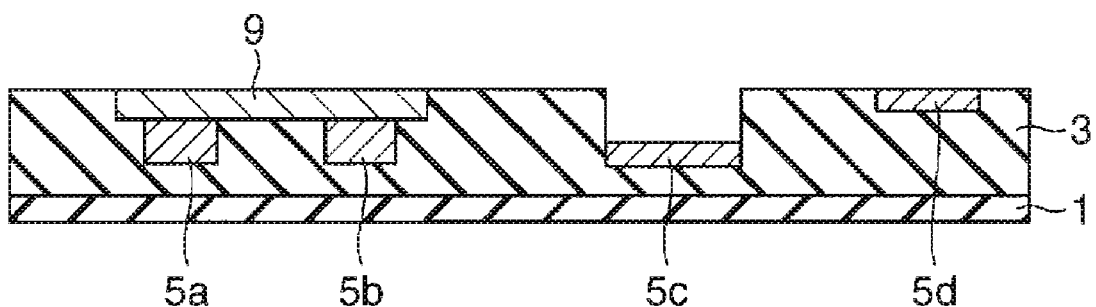

As shown in FIG. 3B, a groove 7 is then formed on the conductive films 5a and 5b by removing part of the photoresist film 3 in the area from the conductive film 5a to the conductive film 5b. Referring to FIG. 3C, a semiconductor film 9 such as silicon film is formed in this groove 7. This silicon film is formed, for instance, using a semiconductor liquid material, by coating a solution of non-doped higher silane composition, and thereafter performing a heat treatment (drying and firing). This higher silane composition solution is a resultant of polymerizing a silane compound by irradiating an ultraviolet light to a silane compound solution. For instance, an ultraviolet light with a wavelength of 405 nm and an intensity of 100 mW/cm$^2$ is radiated to cyclopentasilane (boiling point at 194° C.), which is a low silane compound, and the resultant fluid is diluted in an organic solvent such as toluene so as to prepare the higher silane composition solution. Here, other method such as CVD may be used for forming the silicon film.

Figure 4A:
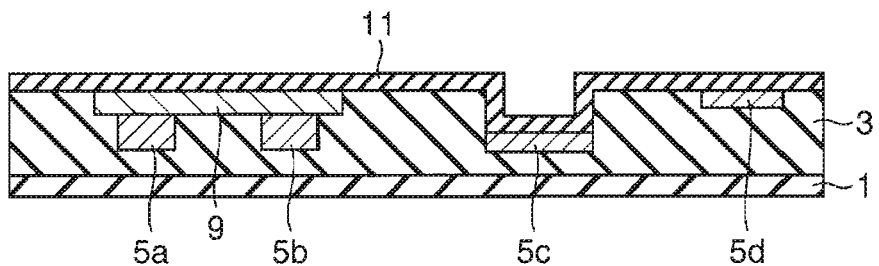
FIGS. 4A and 4B are sectional views of steps showing a method for manufacturing an interconnection according to the above embodiment of the invention.

Referring now to FIG. 4A, with a plasma CVD method, an insulating film 11 such as silicon oxide film is formed on the semiconductor film 9 and on the conductive films 5c and 5d. This insulating film 11 serves, on the semiconductor film 9, as a gate insulating film of the TFT, and, on the conductive film 5d, as a capacitance insulating film of the capacitor Ca.

Figure 4B:
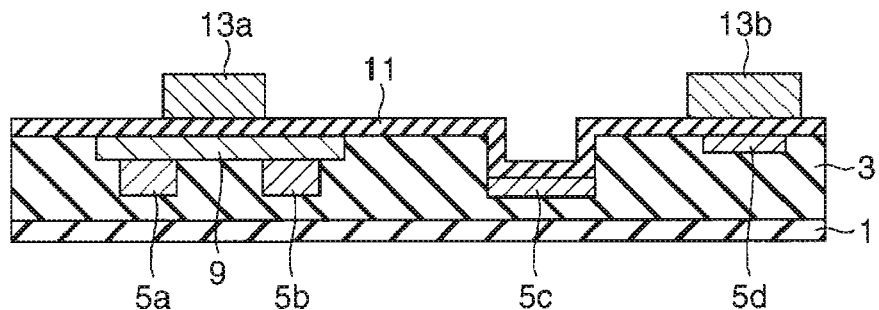

As shown in FIG. 4B, a conductive film is formed on the insulating film 11 with a method such as CVD, and then undergoes patterning, and thus forming conductive films 13a and 13b are formed. The conductive film 13a becomes a gate electrode of the TFT, and the conductive film 13b becomes an upper electrode of a capacitor Ca.

Figure 5A:
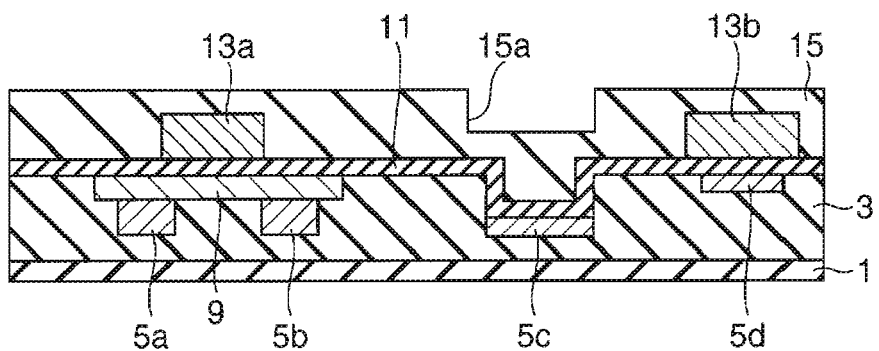
FIGS. 5A and 5B are sectional views of steps showing a method for manufacturing an interconnection according to the above embodiment of the invention.
Figure 5B:
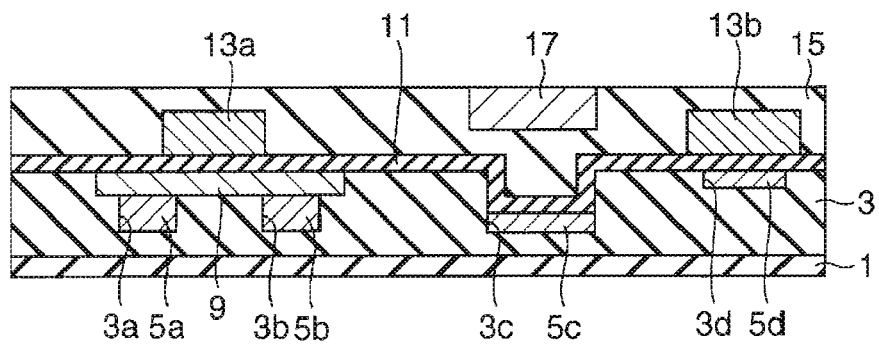

Referring now to FIG. 5A, a groove 15a is formed above the conductive film 5c, by forming a photoresist film 15 on the conductive films 13a and 13b, and thereafter performing exposure and development on the photoresist film 15. Subsequently, as shown in FIG. 5B, a conductive film 17 is formed in the groove 15a, by infusing a conductive liquid material in the groove 15a and performing a heat treatment (drying and firing). The conductive film 17 may also be formed without forming the groove 15a, by depositing and patterning a conductive film on the photoresist film (insulating film) 15. An example of method for depositing the film includes the CVD method.

As described, according to the first embodiment, the grooves 3c and 3d that have different depths are formed, and the conductive films 5c and 5d are formed therein. Therefore, the conductive film 5c is positioned at the location relatively lower than the conductive film 5d, assuring the top-to-bottom spacing between the conductive film 5c and the conductive film 17, thereby reducing the parasitic capacitance in such interconnections. The conductive film 5d is positioned at the location relatively higher than the conductive film 5c, reducing the top-to-bottom spacing between the conductive film 5d and the conductive film 13b, increasing the capacitance of the capacitor Ca.

Figure 6:
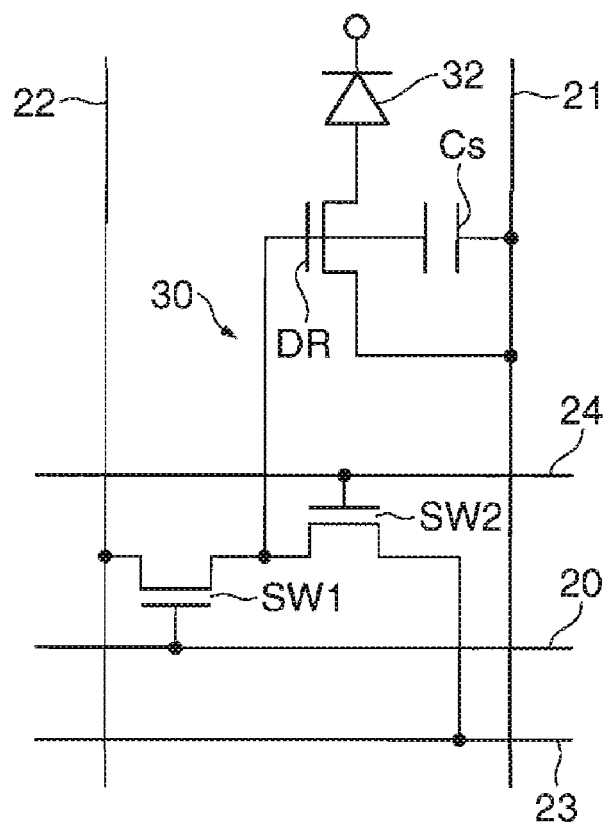
FIG. 6 is a drawing showing an example of a circuit composition of an active matrix organic EL device.

Examples of a semiconductor device having a TFT and a capacitor shown in the first embodiment includes displays such as an organic EL device and liquid crystal device. FIG. 6 is a drawing showing an example of a circuit composition of an active matrix organic EL, device.

For instance, the active-matrix organic EL device includes: a plurality of scanning lines (scanning lines for write-in) 20 and reset lines (scanning line for erasure) 24, both extending in a horizontal direction (a first direction); a plurality of signal lines (data lines) 22 arranged to cross these lines such as scanning lines 20; a plurality of pixel circuits (drive circuits) 30; and a plurality of organic EL elements 32; where both the pixel circuits 30 and the organic EL elements 32 are arranged on the crossing points of the scanning lines 20 and the signal lines 22. Referring to FIG. 6, each of the pixel circuits (drive circuits) 30 and of the organic EL elements 32 are described. What is illustrated in FIG. 6 is obviously a part of the matrix in which the plurality of those circuits and elements are arranged. Moreover, each of the scanning lines 20, the reset lines 24, and the signal lines 22 are respectively connected to drivers that drive them.

The pixel circuit 30 described above is formed including a current control transistor DR, a data write-in transistor SW1, a data-erasure transistor SW2, and a storage capacitor Cs. The source of the current control transistor DR is connected to a power line 21 of an organic light emitting display (OLED), and the drain thereof is connected to one terminal of the organic EL element 32. The organic EL element 32 installed corresponding to the drive circuit 30 is connected, at one terminal, to the drain of the current control transistor DR, and at another terminal, to a common negative electrode. The data write-in transistor SW1 is connected, respectively, at its gate, source, and drain, to the scanning line 20, the signal line 22, and to the gate of the current control transistor DR. The data-deletion transistor SW2 is connected, respectively, at its gate, source, and drain, to the reset line 24, the drain of the data write-in transistor SW1, and to a low-potential power line 23. The storage capacitor Cs is connected in parallel between the gate and the source of the current control transistor DR.

If the first embodiment is applied to such pixel circuits 30, the capacitance of the capacitors can be increased while reducing the parasitic capacitance in the multilayer interconnections.

The circuit configuration shown in FIG. 6 is merely an example of components such as the pixel circuits 30, and may have various modifications. The first embodiment is not limited to the above-described organic EL device, and may be widely applied to circuits of the various semiconductor devices that have multilayer interconnects and capacitors.

A circuitry without capacitors, i.e., interconnect layers where the upper and the lower interconnections cross one another in the top view pattern, can be spaced far apart. For instance, the upper layer interconnection is arranged higher at the cross point than the other part of the upper layer interconnection. As a result, the parasitic capacitance between the multilayer interconnections is reduced. Moreover, by repeating such arrangement in other layers, the total film thickness of the interlayer insulating film can be reduced, allowing the reduction of a film stress.

Another way to secure the top-to-bottom spacing of the interconnections between the conductive film 5c and the conductive film 17 is to set the depth of the grooves 3c and 3d to "T1", and to change the infusion volume of the conductive liquid material described with reference to FIG. 3A. At this time, the top-to-bottom interconnection space may be made narrower between the conductive film 5d and the conductive film 13b.

Second Embodiment

In the first embodiment, parasitic capacitance is reduced and capacitance of capacitor is increased, by changing the height of the lower layer conductive films (the conductive film 5c, i.e., a lower layer interconnection, and the conductive film 5d, i.e., a lower electrode). In the second embodiment, the same thing is achieved by changing the height of the upper layer conductive films (conductive film 17, i.e., upper layer interconnection, and the conductive film 13b, i.e., upper electrode). Like reference numerals designate like structure in the first embodiment, omitting the detailed description thereof.

Figure 7A:
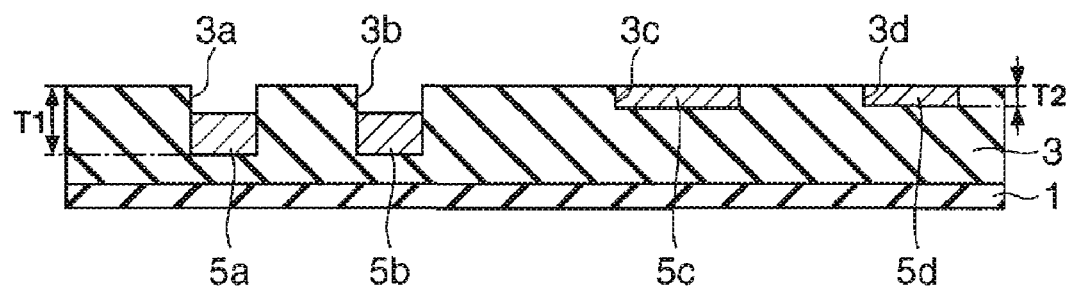
FIGS. 7A to 7C are sectional views of steps showing a method for manufacturing an interconnection according to another embodiment of the invention.
Figure 7B:
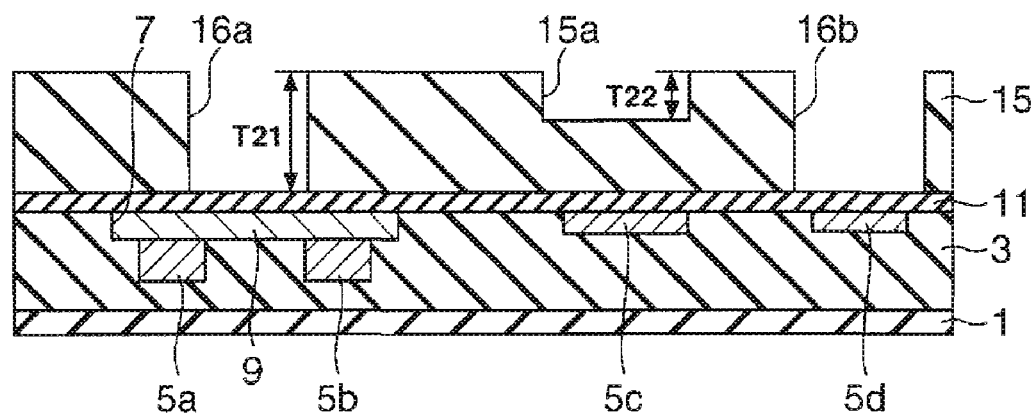
Figure 7C:
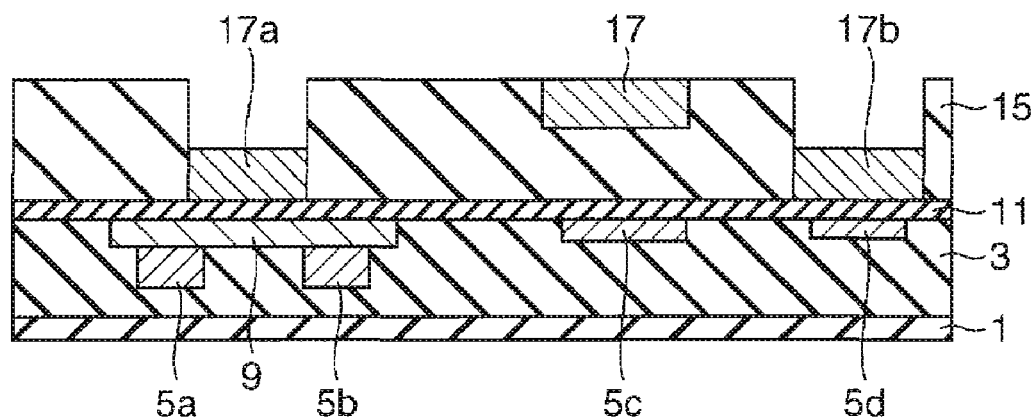

FIGS. 7A to 7C are sectional views of steps showing a method for manufacturing an interconnection according to the second embodiment of the invention. The description of this embodiment will now be described with reference to FIGS. 7A to 7C.

As shown in FIG. 7A, a glass substrate 1 is prepared, and an un-illustrated underlying protection film is formed thereon, similar to the first embodiment. Subsequently, a photoresist is spin coated as a photosensitive insulating film on the glass substrate 1, so as to form a photoresist film 3 on the underlying protection film. Similar to the first embodiment, grooves (interconnection grooves) 3a to 3d are then formed on the surface of the photoresist film 3, by carrying out exposure and lithography to this photoresist film 3. As described with reference to FIG. 2, the top view pattern of the grooves 3a to 3d extends in the y-axis direction, each groove having a desired width. Here, the grooves 3c and 3d have approximately the same depth T2.

Thereafter, similar to the first embodiment, the conductive liquid material is infused into the grooves 3a to 3d, with, for instance, the droplet discharge method. The volume of the conductive liquid material infused into the grooves 3a to 3d is optionally adjusted so that the conductive films with desired thicknesses are formed in the grooves 3a to 3d. Subsequently, a heat treatment (drying and firing) is performed on the conductive liquid material in the grooves 3a to 3d, so as to form the conductive films (interconnections) in the grooves 3a to 3d. The conductive films 5a and 5D become the interconnections leading out from a source and a drain of TFT. A conductive film 5c becomes a lower layer interconnection, and a conductive film 5d becomes a lower electrode of a capacitor Ca. Here, the grooves 3c and 3d have approximately the same depth T2, making the position of the conductive film (lower interconnection) 5c and the conductive film (lower electrode) 5d to be at approximately the same height. These conductive films 5c and 5d may also be formed by depositing and patterning a conductive film by a method such as CVD.

As shown in FIG. 7B, the groove 7 is then formed on the conductive films 5a and 5b by removing part of the photoresist film in the area between the conductive film 5a and the conductive film 5b. Thereafter, the semiconductor film 9 such as silicon film is formed in this groove 7, in a manner similar to that of the first embodiment. Subsequently, with a plasma CVD method, the insulating film 11 such as silicon oxide film is formed on the semiconductor film 9 and on the conductive films 5c and 5d. This insulating film 11 serves, on the semiconductor film 9, as a gate insulating film of the TFT, and, on the conductive film 5d, as a capacitance insulating film of the capacitor Ca.

The photoresist film 15 is then formed on the insulating film 11. Thereafter, the grooves (interconnection grooves) 15a, 16a, and 16b are formed on the surface of the photoresist film 15, by carrying out exposure and lithography to this photoresist film 15. The grooves 15a, 16a, and 16b each have a desired width. The grooves 16a and 16b have a depth T21, and the groove 15a has the depth T22 (T22<T21). In other words, the groove 15a is shallower than the grooves 16a and 16b. That is to say, the bottom surface of the groove 15a is at a higher position than the bottom surfaces of the grooves 16a and 16b. The distance between the conductive film 5c and the bottom of the groove 15a is larger than that of between the conductive film 5d and the groove 16b.

The grooves 15a, 16a, and 16b having such shapes are formed by the exposure and development of the photoresist film 15, as described in the first embodiment. Moreover, by reducing the exposure dose in the groove 15a compared to that of the grooves 16a and 16b, the depth T22 of the groove 15a becomes shallow. As described, an etching process can be omitted by using the photosensitive insulating film, thereby allowing to form the grooves 15a, 16a, and 16b in fewer processes. Moreover, by adjusting the exposure dose, the grooves with different depths are formed. The grooves 15a, 16a, and 16b may be formed also by patterning a non-photosensitive insulating film as well.

Thereafter, as shown in FIG. 7C, the conductive liquid material is infused into the grooves 15a, 16a, and 16b, with, for instance, a droplet discharge method. Here, as described in the first embodiment, the droplets may be discharged on demand along those grooves. The droplets may also be discharged collectively into a liquid reservoir (a pool) installed with a continuous connection to the grooves, so as to introduce the droplets. The volume of the conductive liquid material infused into the grooves 15a, 16a, and 16b is optionally adjusted so that the conductive films with desired thicknesses are formed in those grooves. Subsequently, a heat treatment (drying and firing) is performed on the conductive liquid material in the grooves 15a, 16a, and 16b, so as to form the conductive films (interconnections) 17, 17a, and 17b in the grooves 15a, 16a, and 16b. Here, the conductive film 17a, the conductive film 17b, and the conductive film 17b each respectively become a gate electrode, an upper interconnection, and a lower electrode of the capacitor Ca. Thereafter, an un-illustrated insulation film is formed on those conductive films.

As described, according to the first embodiment, the grooves 15a and 16b that have different depths are formed, and the conductive films 17 and 17b are formed therein.

Therefore, the conductive film 17 is positioned at the location relatively lower than the conductive film 5c, assuring the top-to-bottom spacing between the conductive film 5c and the conductive film 17, thereby reducing the parasitic capacitance in such interconnections. The conductive film 17b is positioned at the location relatively lower than the conductive film 5d, reducing the top-to-bottom spacing between the conductive film 17 and the conductive film 5d, increasing the capacitance of the capacitor Ca. Moreover, it is possible to concurrently form both the conductive film 17a that serves as a gate insulation film, and these conductive films 17 and 17b.

Here, these conductive films may also form a continuous pattern.

Third Embodiment

While in the other embodiments such as the first embodiment, the grooves 3c and 3d (a conductive films 5c and 5d) are formed into a separate pattern extending to the v-axis direction (refer to FIG. 2), these grooves may also be formed into a continuous pattern.

FIGS. 8A to 9C are drawings of sectional views of processes and top view of main parts, showing a method for manufacturing an interconnection according to the third embodiment of the invention. This embodiment will now be described with reference to these drawings.

Figure 8A:
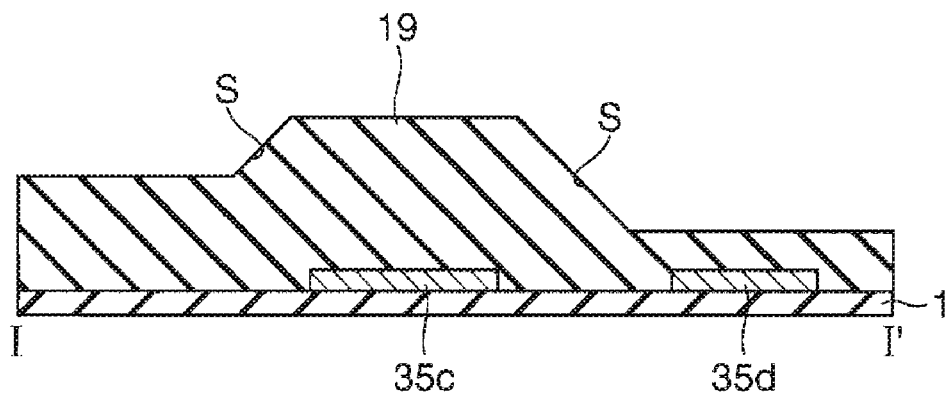
FIG. 8A is a sectional view of a step, showing a method for manufacturing an interconnection according to another embodiment of the invention.

As shown in FIG. 8A, the glass substrate 1 is prepared. On this glass substrate, a conductive film 35c (hereafter also referred to as "lower/upper layer interconnection 35c") and a conductive film 35d (hereafter also referred to as "lower/upper electrode 35d") are formed on an un-illustrated underlying protection film on the glass substrate 1. Thereafter, a photoresist film 19 is formed on the un-illustrated underlying protection film, including these conductive films.

Grooves (interconnection grooves) 19a and 19b are then formed on the surface of the photoresist film 19, by carrying out exposure and lithography to this photoresist film 19. Referring now to FIGS. 8A to 9C, the shapes of these grooves 19a and 19b will be described. FIG. 8A and FIG. 9C correspond to a section cut along the line I-I' in FIG. 8B. FIG. 9A and FIG. 9B correspond to a section cut along the lines II-II' and III-III' in FIG. 8B.

Figure 8B:
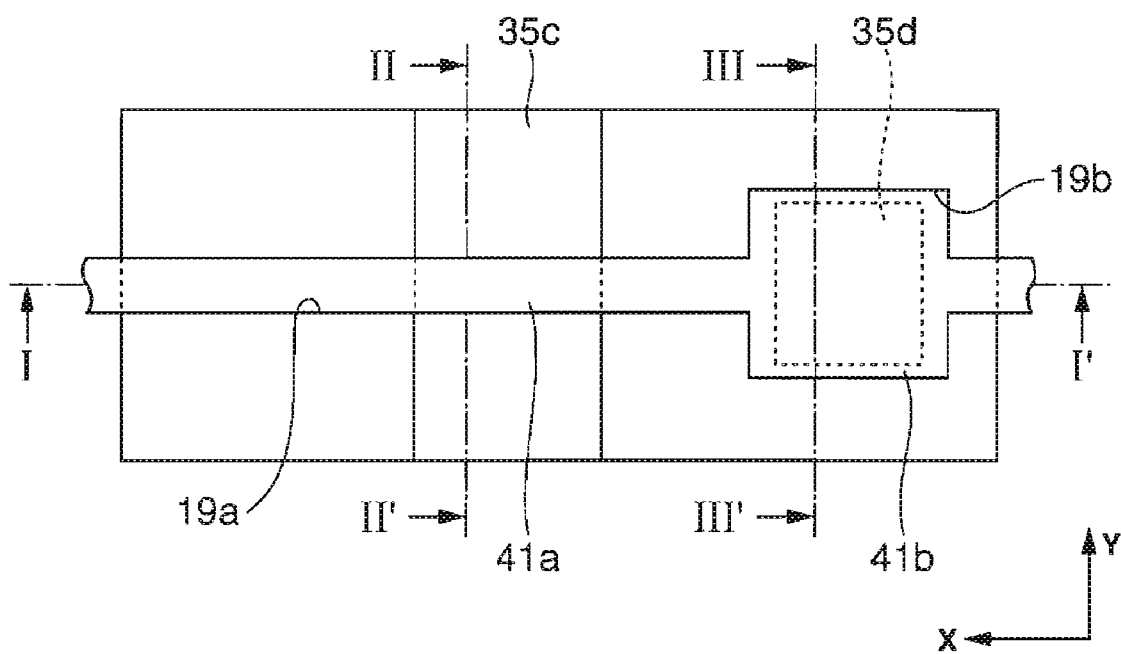
FIG. 8B is a top view of main parts showing the method.
Figure 9A:
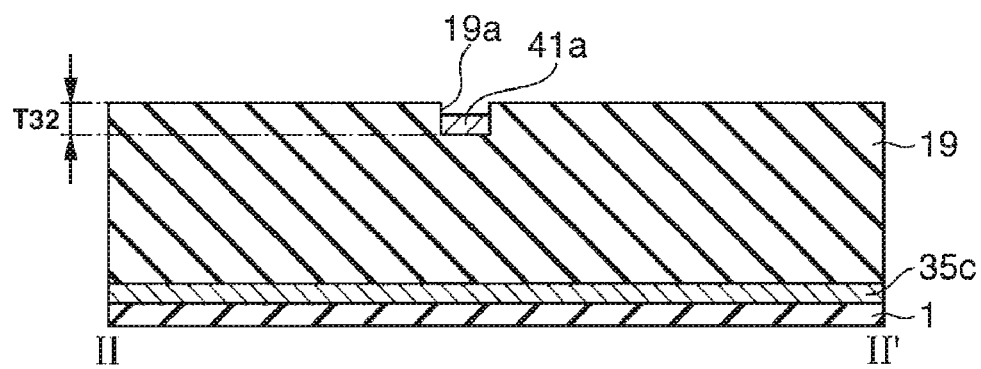
FIGS. 9A to 9C are sectional views of a step showing a method for manufacturing an interconnection according to the above embodiment of the invention.
Figure 9B:
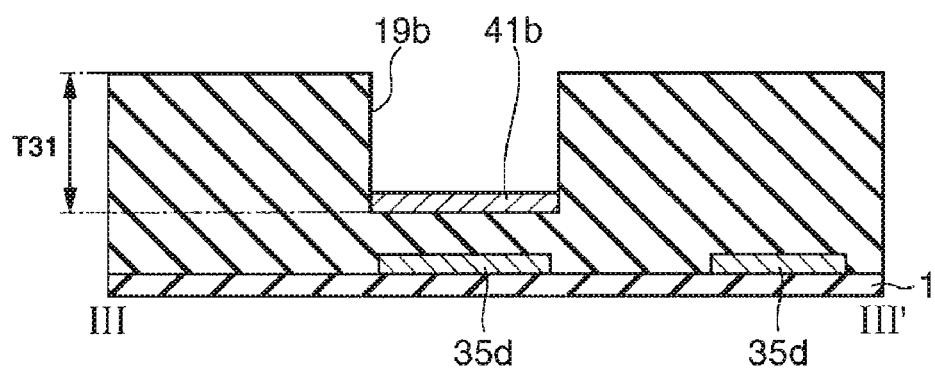
Figure 9C:
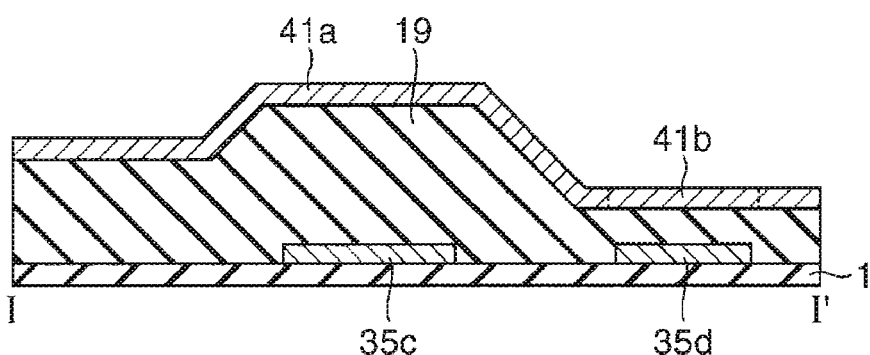

As shown in FIG. 8B, the groove 19a extends in the x-axis direction and a part thereof widens and becomes the groove 19b. As shown in FIGS. 9A and 9B, the groove 19a has a depth T32 at the line II-II', and the groove 19b has a depth T31 (T31<T32). In other words, the groove 19a is shallower than the groove 19b at the line II-II'. That is to say, the bottom surface of the groove 19a is at a higher position than the bottom surface of the groove 19b.

The grooves 19a and 19b having such shapes are formed by the exposure and development of the photoresist film 19. For instance, using a maskless lithography system (digital micromirror device), writing is performed while adjusting a light intensity (exposure dose) by on/off toggling of the micromirror, frequency of superposition, and time, thereby forming a shallow groove and a deep groove. Another way of adjusting the depth of the grooves is to provide successive shots along the pattern formed, so that the depth of the groove can be adjusted by increasing the number of shots that have a given constant exposure dose. In other words, the deep groove (for instance, the groove 19b) receives a larger number of shots and the shallow groove (for instance, the groove 19a) receives a smaller number of shots. At an incline S of the groove (refer to FIG. 8A), the incline is formed at the bottom of the groove, by either gradually increasing (or decreasing) the number of shots, or, decreasing (or increasing) the intervals between the shots. Moreover, the light intensity may be increased or decreased in accordance with the region to be exposed, so as to form a deep area or a shallow area of the groove.

As described, a groove including areas that are deep, shallow, and inclined is easily formed, by adjusting the exposure dose when using a photolithography technique with a photosensitive insulation film (photoresist film 19).

Thereafter, as shown in FIG. 9C, the conductive liquid material is infused into the continuous pattern of grooves 19a and 19b, with, for instance, a droplet discharge method. Here, the droplets may be discharged on demand along those grooves. The droplets may also be discharged collectively into a liquid reservoir (a pool) installed with a continuous connection to the grooves, so as to introduce the droplets. Subsequently, a heat treatment (drying and firing) is performed on the conductive liquid material in the grooves 19a and 19b, so as to form the conductive films (interconnections) in the grooves 41a and 41b. Here, the conductive film 41a becomes an upper layer interconnection portion, and the conductive film 41b becomes an upper electrode of the capacitor Ca. Thereafter, an insulation film is formed on the conductive films 41 and 41b.

As described, according to the third embodiment, the grooves 19a and 19b are formed, these grooves forming a continuous pattern with different depths. Further, the conductive films 41a and 41b are formed in these grooves. Therefore, the conductive film 41a is arranged in a position higher than the lower layer interconnection 35c at the area where the conductive film 41a and the lower layer interconnection 35c intercross, thereby reducing the parasitic capacitance between such interconnections. At the same time, in the region facing the lower electrode 35d of the capacitor Ca, the conductive film 41b is arranged in a low position, thereby the capacitance of the capacitor Ca is increased.

Moreover, a groove including areas that are deep, shallow, and inclined is easily formed, by adjusting the exposure dose when using a photolithography technique with a photosensitive insulation film. Therefore the conductive films (interconnections) are made into a three dimensional interconnection.

The method forming the groove applied in the above processes described with reference to FIGS. 8A to 9C may be applied for forming a lower layer conductive film, while in the above processes of forming the groove including areas that are deep, shallow, and inclined, the method is applied for forming the upper layer conductive film.

Figure 10:
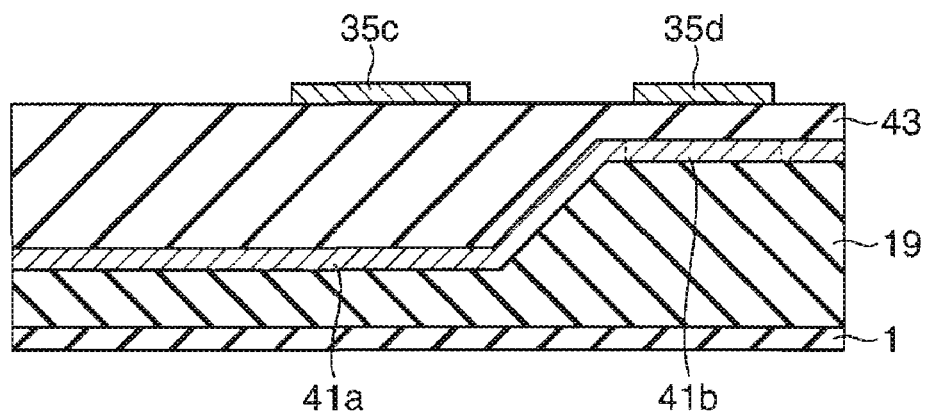
FIG. 10 is a sectional view of a step showing a method for manufacturing another interconnection according to the above embodiment of the invention.

FIG. 10 is a sectional view of a step showing a method for manufacturing another interconnection according to the third embodiment of the invention. As shown in the drawings, the photoresist film 19 is formed on the glass substrate 1, and thereafter, similar to the above processes, a groove including deep, shallow, and inclined areas is formed. A conductive liquid material is then infused into the groove, followed by a heat treatment (drying and firing). Consequently, the conductive films 41a and 41b are formed in the groove. Here, the conductive film 41a becomes a lower layer interconnection portion, and the conductive film 41b becomes a lower electrode of the capacitor Ca. The difference between these processes and the previously described processes is that the groove is formed so that the conductive film 41a is at a low position and the conductive film 41b is at a high position. Thereafter; an insulation film 43 is formed. The conductive film (upper layer interconnection) 35c and the conductive film (upper electrode) 35d are formed on this insulation film 43.

Figure 11A:
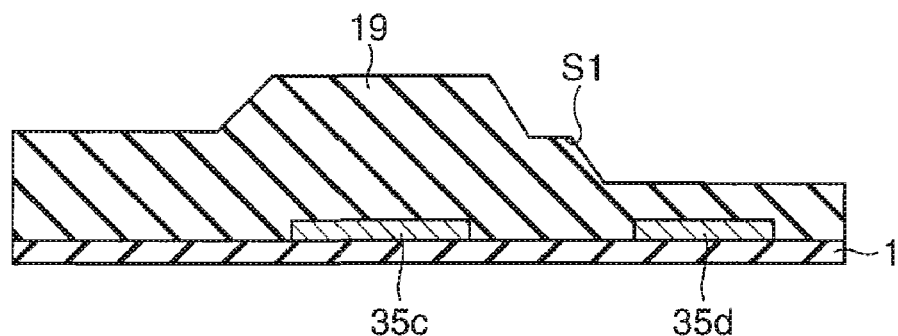
FIGS. 11A and 11B are sectional views of a step showing a method for manufacturing another interconnection according to the above embodiment of the invention.
Figure 11B:
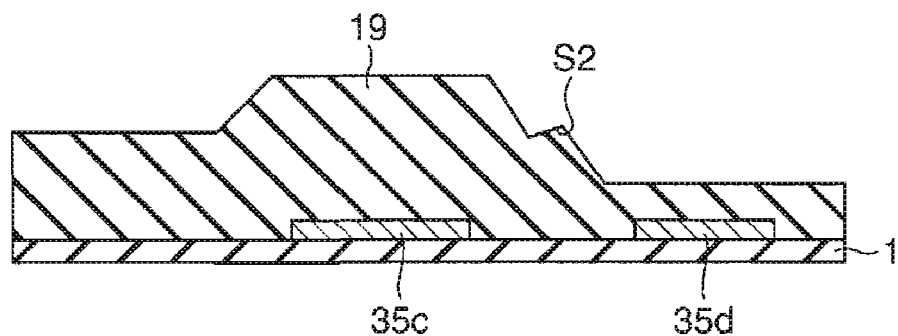

In the previously described processes, the shape of the incline S is a simple slope. Other shapes of the incline S include the ones illustrated in FIGS. 11A and 11B, having a flat portion S1 or a reverse slope (reverse incline) S2. FIGS. 11A and 11B are sectional views of a step showing a method for manufacturing another interconnection according to the third embodiment of the invention. Referring to those drawings, the conductive liquid material stays on the incline better than the case shown in FIG. 8A, by providing the flat portion S1 or the reverse slope (reverse incline) S2. Therefore, in the case of using a less viscous conductive liquid material, a predefined film thickness on the incline is assured. Such flat portion S1 or the reverse slope S2 may be provided in several locations, depending on the length of the incline.

Fourth Embodiment

Figure 12A:
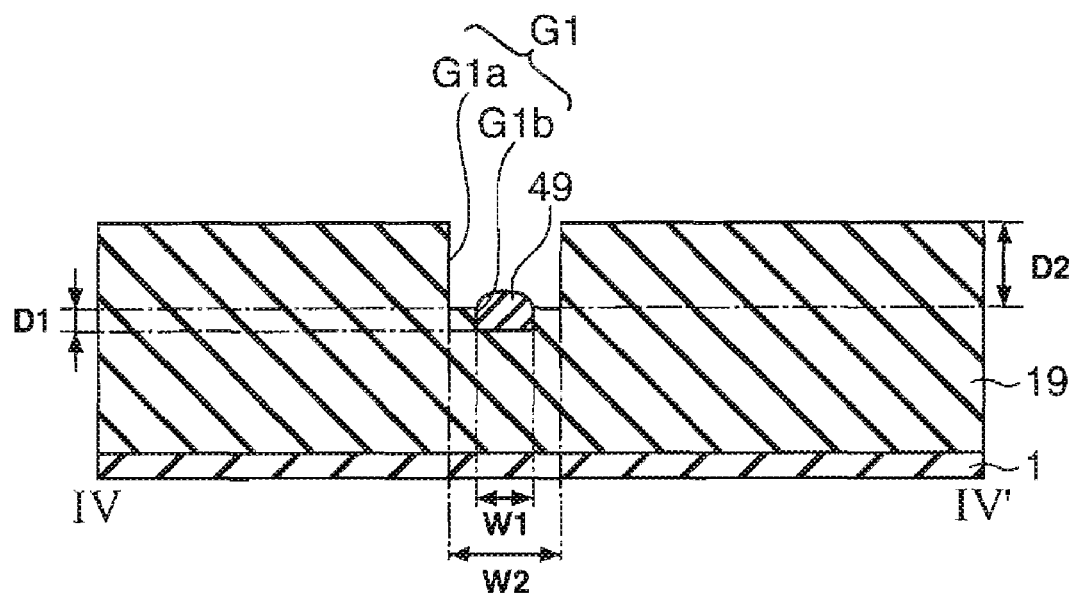
FIGS. 12A and 12B are sectional views of a step showing a method for manufacturing an interconnection according to still another embodiment of the invention.
Figure 12B:
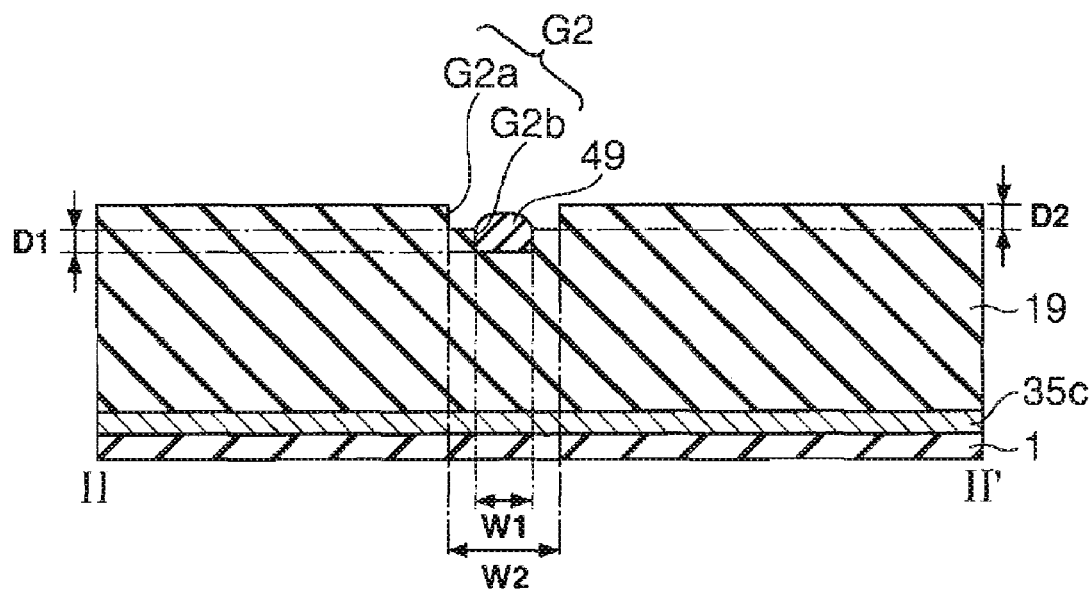
Figure 13A:
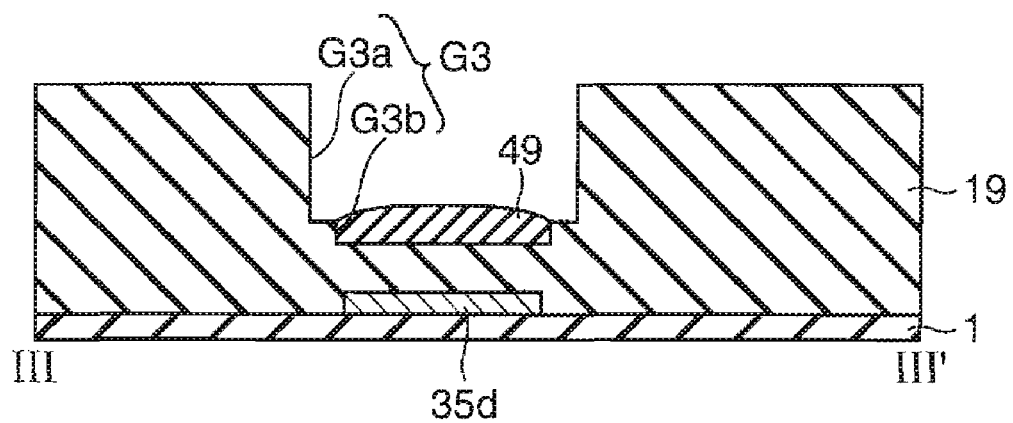
FIG. 13A is a sectional view of a step, showing a method for manufacturing an interconnection according to the above embodiment of the invention.
Figure 13B:
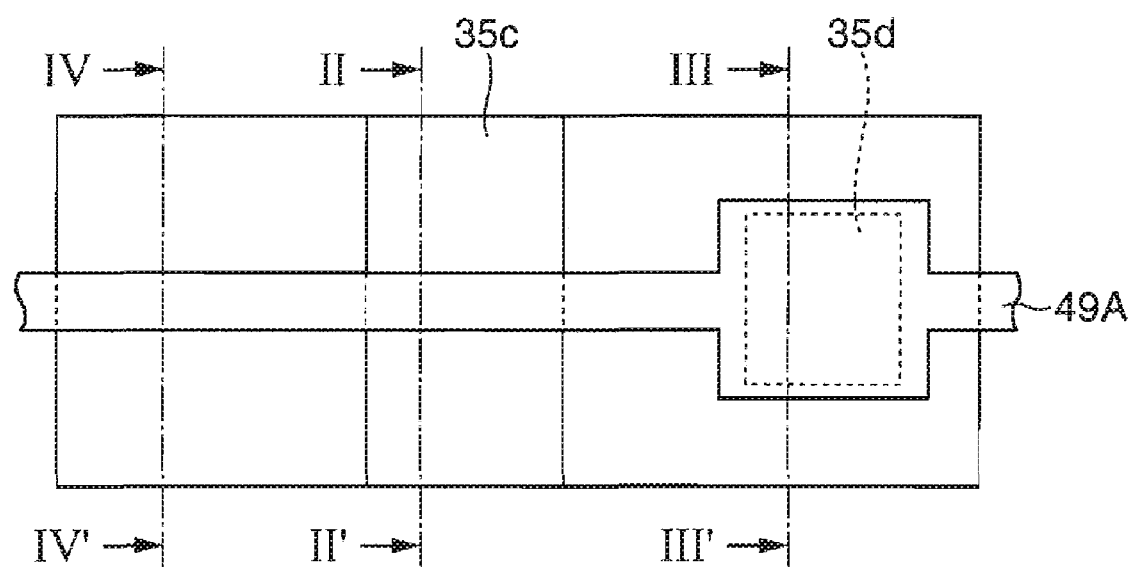
FIG. 13B is a top view of main parts showing the method.

FIGS. 12A and 12B are either sectional views of a step or top views of main parts, showing a method for manufacturing an interconnection according to a fourth embodiment of the invention. FIG. 12A, FIG. 12B, and FIG. 13A correspond to a section IV-IV', II-II', and III-III' in FIG. 13B. This embodiment will now be described with reference to these drawings.

In this embodiment, as shown in FIG. 12A, a groove G1 in the photoresist film 19 is formed as including: a narrow groove G1$b$ having a width of W1 and a depth of D1 (i.e., a height or a height of a sidewall); and a wide groove G1$a$ having a width W2 (W2>W1) and a depth D2. In other words, the groove G1 has the width W2, and includes the narrow groove G1$b$ approximately in the center of the bottom surface of the wide groove G1$a$ that has the depth D2, the narrow groove G1$b$ having the depth of D1 and the width of W1 (<W2). That is to say, the structure of the groove G1 is such that in the central area of the width W2, i.e., at the width W1, the groove G1 has a depth of "D1+D2", being deeper than the depth D2. This structure provides the sidewall of the groove G1 with a shape of two stairs. Hereafter, this groove structure is referred to as a shape of a double-groove.

A groove G2 is formed including a narrow groove G2$b$ with the width of W1 and the depth of D1, and a wide groove G2$a$ with the width of W2 (W2>W1) and the depth of D2, where the depth D2 of the groove G2$a$ is less deep than the depth D2 of the groove G1$a$.

A groove G3 (capacitor) also has the shape of a double-groove, including a wide groove G3$a$ and a narrow groove G3$b$, and the width thereof widening proportionally to the pattern of the capacitor Ca (FIG. 13A).

Such shape of the double-groove can be formed by adjusting the exposure dose. For instance, a wide groove can be made shallow by methods such as: arranging a translucent mask that reduces the exposure dose in a location corresponding to the area within the width W2, but not within the width W1, in other words, both sides outside of the width W1; adjusting the light intensity in this area, as described in detail in the third embodiment; or reducing the shot frequency of exposure.

Thereafter, a conductive liquid material 49 is infused into the narrow grooves G1$b$, G2$b$, and G3$b$, with, for instance, a droplet discharge method. Here, it is preferable that the conductive liquid material 49 be filled into the narrow groove G1$b$ so that the surface of the fluid forms a convex caused by a surface tension. Subsequently, with a heat treatment (drying and firing), a conductive film (interconnection) 49A is formed in the narrow grooves such as the narrow groove G1$b$ (refer to FIG. 13B).

Here, using, for instance, a droplet discharge method, the droplets may be discharged on demand along those grooves, or, may be discharged collectively into a liquid reservoir (a pool) installed with a continuous connection to the grooves, so as to introduce the droplets into the grooves. Here, the width of the liquid reservoir is wider than each of the widths of the grooves. With this method, the liquid material can be filled into the grooves that are narrower than the droplet size (droplet diameter) of the conductive liquid material. Here, the width W1 of the narrow grooves except for the part corresponding to the capacitor area is smaller than the droplet size, and the width of the liquid reservoir is larger than the droplet size.

Each of the widths of the conductive film 49A corresponds to each of the widths of the narrow grooves G1$b$, G2$b$, and G3$b$. Each of the film thicknesses thereof also corresponds to each of the depths of those grooves. The film thickness of the conductive film becomes smaller than the depth D1, caused by the evaporation of the solvent and concentration (sintering) of metal particles. The conductive film 49A with the desired film thickness can optionally be formed by taking into consideration the decrease in the film thickness described above in advance, when setting the depth D1 of the grooves such as the narrow groove G1$b$.

In order to assure the flatness of the bottom surface of the narrow groove G1$b$, the coating volume of the photoresist film 19 is preferably set in advance so that the film thickness of the photoresist film 19 will be larger than the sum of the depths D1 and D2 (D1+D2), even where the layer below the photoresist film 19 has the highest point. In this case, the photoresist film 19 is exposed at the bottom surface of the narrow groove G1$b$, not the layer (film) under it.

As described, the double-groove shape reduces the film thickness fluctuation of the conductive film 49A, thereby improving the electromigration (EM) resistance. Here, by optionally modifying the depth D2 of the wide grooves G1$a$, G2$a$, and G3$a$, the height of the bottom surfaces of the narrow grooves G1$b$, G2$b$, and G3$b$, i.e., the position of the conductive film, can be adjusted, while keeping the film thickness of the conductive film even.

The conductive liquid material used in the first to the fourth embodiments will now be described. Examples of the "conductive liquid material" includes: a functional fluid, resultant of a metallic fluid which is mixed into a dispersion medium, as is described below; and a fluid, resultant of an organic metallic compound which is dissolved. Here, the conductive liquid material indicates a liquid material in a wide definition; including both a solvent and mixed solution (a dispersion liquid), into which the conductive material is dissolved or mixed (diffused). Any fluid, with which the conductive film is formed as a result of performing some sort of treatments such as a heat treatment to the fluid, is included.

The functional fluid, which is a kind of the conductive liquid material, will now be described. The functional fluid is a solution a resultant of which the conductive fine particles (metal fine particles) are mixed into a dispersion medium. Here, the uniformity in the concentration of the metal particles can be improved by adding the dispersion medium (dispersing agents, solvent). Examples of the metal fine particles include gold, silver, copper, palladium, and nickel, tin addition to these metal fine particles, oxides of the aforementioned conductive metals, conductive polymers, and superconductive fine particles may also be used. The grain size (diameter) of such conductive fine particles is preferably between 1 nm and 0.1 μm inclusive. This is because if the size is larger than 0.1 μm, nozzle clogging of a droplet discharge outlet (head nozzle) may occur. If the size is smaller than 1 nm, a volume ratio of the conductive fine particles to the solute and solvent other than those particles decreases, and the proportion of the organic matter remaining in the obtained film increases, possibly causing the degradation in the performance of the film.

No particular limitation is imposed on the dispersion medium, as long as it is a solution that inhibits coagulation of the conductive fine particles and promotes dispersion. Examples of such dispersion medium include: water; alcohols such as methanol, ethanol, propanol, and butanol; hydrocarbon compounds such as n-heptane, n-octane, decane, dodecane, tetradecane, toluene, xylene, cymene, durene, indene, dipentene, tetrahydronaphthalene, decahydronaphthalene, and cyclohexylbenzene; ether compounds such as ethylene glycol di methyl ether, ethylene glycol diethyl ether, ethylene glycol methyl ethyl ether, diethylene glycol methyl ethyl ether, 1,2-dimethoxyethane, bis(2-methoxyethyl) ether, and p-dioxane; and polar compounds such as propylene carbonate, gamma-butyrolactone, N-methyl-2-pyrrolidone, dimethylformamide, dimethyl sulfoxide, and cyclohexanone. Other solvents may optionally added in addition to the fine particles and the dispersion medium, and the dispersion medium may be an optional mix of the above-described fluids.

Among the above, water, alcohols, chemical compound of hydrocarbon halide system, and chemical compound of ether system are preferable for facilitating the application of those material in the droplet discharge method. Particularly, water and the chemical compound of hydrocarbon halide are most optimal.

Moreover, a metal film may also be grown into a conductive film by plating. For instance, a plating solution, a resultant of which palladium (Pd) catalyst or silver (Ag) catalyst is added into a silane coupling agent, is prepared. Using this solution, the conductive film is grown by electroless plating in the first groove. Here, a seed layer may be formed in advance on the bottom surface of the groove, the layer serving as the seed of a plated metal film. The method for forming the conductive film is not limited thereto, and may also include the one that uses an organic metal compound solution.

As described, the first embodiment of the invention can be widely applied to the circuitries of various semiconductor devices that have multilayer interconnections and capacitors, such as the pixel circuit 30. The same thing also applies to the second to the fourth embodiments. Likewise, the second to fourth embodiments may also be applied to a simple multilayer interconnection, where, for instance, the upper and the lower interconnections cross one another in the top view pattern.

A positive photoresist insulating film is preferably used as a photosensitive insulating film. This is because the sectional view of the grooves become an inverted trapezoid, when such a positive photoresist insulating film is used.

The present invention is not limited to the descriptions of the above-referenced embodiments. The examples and applications thereof described throughout the above-referenced embodiments may be optionally combined according to the application, and can be used with modification or refinement. Embodiments including such a combination, a modification, or a refinement also fall within the technical scope of the invention.

Description of Electro-Optical Device and Electronic Apparatus

Description of electro-optical devices and electronic apparatuses that use the displays such as TFTs described in the first embodiment will now be described.

Figure 14A:
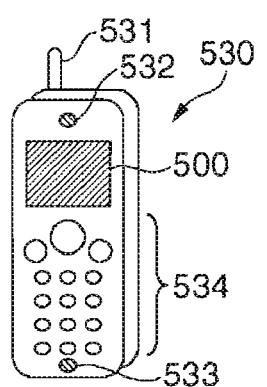
FIGS. 14A to 14D are drawings showing examples of electronic apparatuses using an electro-optical device.
Figure 14B:
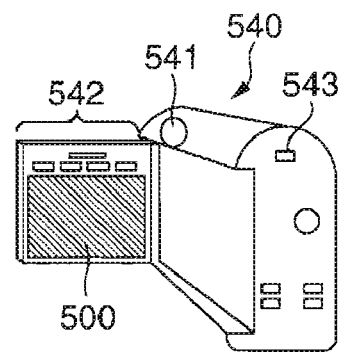
Figure 14C:
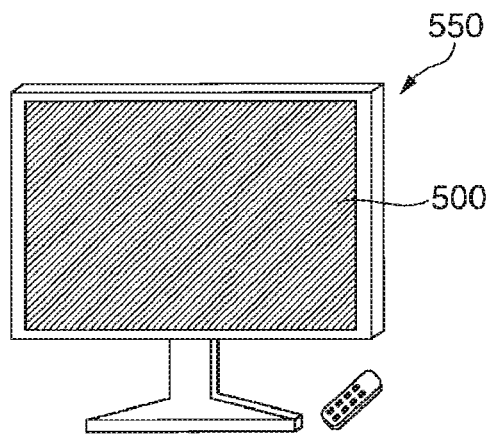
Figure 14D:
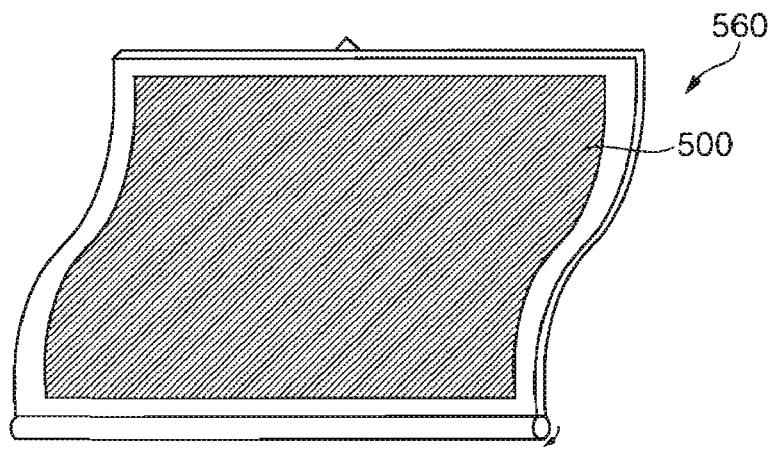

For instance, the TFTs are used in a liquid crystal panel that functions as a display unit of an electro-optical device (display) or an electronic apparatus. Referring now to FIGS. 14A to 14D, examples of the electronic apparatus using the electro-optical device is shown. FIG. 14A is the example in which the display unit is applied to a mobile phone, and FIG. 14B is the example applied to a video camera. FIG. 14C indicates the example applied to a television, and FIG. 14D is the example applied to a roll-up television.

Referring to FIG. 14A, a mobile phone 530 includes an antenna 531, a sound output unit 532, a sound input unit 533, an operation unit 534, and an electro-optical device (display unit) 500. The interconnection and the forming method thereof according to the embodiments of the invention may be used in this electro-optical device.

Referring to FIG. 14B, a video camera 540 includes a receiver 541, an operation unit 542, a sound input unit 543, and the electro-optical device (display unit) 500. The interconnection and the forming method thereof according to the embodiments of the invention may be used in this electro-optical device.

Referring to FIG. 14C, a television 550 is provided with the electro-optical device (display unit) 500. The interconnection and the forming method thereof according to the embodiments of the invention may be used in this electro-optical device. The interconnection and the forming method thereof according to the embodiments of the invention may also be used in a monitoring device (the electro-optical device) used for apparatuses such as a personal computer.

Referring to FIG. 14D, a roll-up television 560 is provided with the electro-optical device (display unit) 500. The interconnection and the forming method thereof according to the embodiments of the invention may be used in this electro-optical device.

Other examples of the electronic apparatus provided with the electro-optical device include: a fax device with a display function, a view-finder of a digital camera, a mobile television, an electronic notebook, an electrical bulletin board, and a display for advertising.

The interconnection and the forming method thereof according to the embodiments of the invention may also be used for other various electronic apparatuses.

The entire disclosure of Japanese Patent Application No: 2006-132953, filed May 11, 2006 is expressly incorporated by reference herein.

What is claimed is:

1. A method of manufacturing a semiconductor device, comprising:
    (a) forming a first insulating film over a substrate;
    (b) forming a first groove and a second groove by selectively removing the first insulating film, the first groove having a first depth and the second groove having a second depth, the second depth being smaller than the first depth, a bottom surface of the second groove being a portion of the first insulating film;
    (c) infusing a first conductive liquid material into the first groove and a second conductive liquid material into the second groove;
    (d) treating the first conductive liquid material in the first groove and the second conductive liquid material in the second groove to form a first conductive film and a second conductive film, respectively;
    (e) forming a second insulating film over the first conductive film and the second conductive film; and
    (f) forming a third conductive film on the second insulating film, the second conductive film serving as a first electrode constituting a capacitor, and an area located above the second conductive film in the third conductive film serving as a second electrode constituting the capacitor.

2. The method of manufacturing a semiconductor device according to claim 1, the first conductive film serving as a first interconnection, and the third conductive film except for the second electrode therein serving as a second interconnection.

3. The method of manufacturing a semiconductor device according to claim 1, the first groove includes an incline between an area above the first conductive film and an area above the second conductive film.

4. The method of manufacturing a semiconductor device according to claim 1, the first groove including a first incline, a flat area, and a second incline, between an area above the first conductive film and an area above the second conductive film.

5. The method of manufacturing a semiconductor device according to claim 1, the first groove including a first incline, a reverse incline, and a second incline, between an area above the first conductive film and an area above the second conductive film.

6. The method of manufacturing a semiconductor device according to claim 1, step (c) including introducing the first conductive liquid material after discharging the conductive liquid material to a fluid reservoir wider than the first groove, the fluid reservoir being arranged at an edge of the first groove.

7. The method of manufacturing a semiconductor device according to claim 1, the first groove including a wide groove having a first width and a narrow groove having a second width, the narrow groove being located approximately in the center of the wide groove.

8. The method of manufacturing a semiconductor device according to claim 7, in step (c), the first conductive liquid material being introduced after discharging the first conductive liquid material to a fluid reservoir wider than the narrow groove, the fluid reservoir being arranged at the edge of the first groove.

9. The method of manufacturing a semiconductor device according to claim 8, the discharging of the first conductive liquid material to the liquid reservoir being carried out by seeping a droplet of the first conductive liquid material with an inkjet method,
the second width being partially smaller than the size of the droplet, and the width of the liquid reservoir being larger than the size of the droplet.

10. The method of manufacturing a semiconductor device according to claim 1, the first groove including a first wide groove having a first width and a first narrow groove having a second width, the first narrow groove located approximately in the center of the first wide groove,
the second groove including a second wide groove having a third width and a second narrow groove having a fourth width, the second narrow groove being located approximately in the center of the second wide groove,
the depth of the first and second narrow grooves being approximately constant, and the depth of the first wide groove being smaller at an area above the first conductive film than the depth of the second wide groove at an area above the second conductive film.

11. The method of manufacturing a semiconductor device according to claim 1, the infusion of the first conductive liquid material and the second conductive liquid material being carried out by seeping the first and second conductive liquid materials with an inkjet method.

12. The method of manufacturing a semiconductor device according to claim 1, the first insulating film being composed with photosensitive material.

13. The method of manufacturing a semiconductor device according to claim 1, the treatment being carried out by performing a heat treatment to the first conductive liquid material and the second conductive liquid material, at least one of the first and second conductive liquid materials including conductive fine particles and a dispersion medium.

14. The method of manufacturing a semiconductor device according to claim 1, the treatment being carried out by growing the first and second conductive films with plating, and
the conductive liquid material including a catalyst.

15. A method of manufacturing an electronic apparatus having the semiconductor device, the method including the method of manufacturing a semiconductor device according to claim 1.

16. A method of manufacturing a semiconductor device, comprising:
(a) forming a first conductive film and a second conductive film over a substrate;
(b) forming a first insulating film over the first and the second conductive films;
(c) forming a first groove and a second groove by selectively removing the first insulating film, the first groove being above the first conductive film and the second groove being above the second conductive film, wherein a distance from the first conductive film to a bottom of the first groove is longer than a distance from the second conductive film to a bottom of the second groove, the bottom of the second groove being a portion of the first insulating film;
(d) infusing a conductive liquid material into the first groove and the second groove; and
(e) treating the conductive liquid material to form a third conductive film in the first groove and the second groove, the second conductive film serving as a first electrode constituting a capacitor, and an area located above the second conductive film in the third conductive film serving as a second electrode constituting the capacitor.

* * * * *